United States Patent
Stabenau

(10) Patent No.: US 6,829,738 B2
(45) Date of Patent: Dec. 7, 2004

(54) CONFIGURATION FOR TESTING AN INTEGRATED SEMICONDUCTOR MEMORY AND METHOD FOR TESTING THE MEMORY

(75) Inventor: Birgit Stabenau, München (DE)

(73) Assignee: Infineon Technologies AG, Munich (DE)

( * ) Notice: Subject to any disclaimer, the term of this patent is extended or adjusted under 35 U.S.C. 154(b) by 424 days.

(21) Appl. No.: 10/106,591

(22) Filed: Mar. 26, 2002

(65) Prior Publication Data

US 2002/0138798 A1 Sep. 26, 2002

(30) Foreign Application Priority Data

Mar. 26, 2001 (DE) ......................................... 101 14 776

(51) Int. Cl.[7] ............................. G11C 29/00; G06F 7/02
(52) U.S. Cl. ...................................... 714/718; 714/820
(58) Field of Search .............................. 714/43, 42, 54, 714/724, 718, 719, 736, 733, 819, 820, 821; 365/200, 201

(56) References Cited

U.S. PATENT DOCUMENTS 6,141,779 A * 10/2000 Hill et al. ................... 714/710
6,550,023 B1 * 4/2003 Brauch et al. ................ 714/42
6,668,348 B1 * 12/2003 Nakamura ................... 714/733
2001/0009524 A1 * 7/2001 Koto ........................... 365/201

FOREIGN PATENT DOCUMENTS

JP    2000 207 900 A    7/2000

* cited by examiner

*Primary Examiner*—Christine T. Tu
(74) *Attorney, Agent, or Firm*—Laurence A. Greenberg; Werner H. Stemer; Gregory L. Mayback

(57) ABSTRACT

A configuration for testing an integrated semiconductor memory having a control I/O terminal and data I/O terminals, is described, and in which case test signals are prescribed by a test unit. The configuration has a circuit inserted into the signal path between the test unit and the memory. The circuit contains a data writing device for receiving test data from the test unit and for outputting the test data to the memory, a control signal writing device for receiving test control signals of a control channel of the test unit and for outputting the test control signals to the memory, and a reading/coding device for receiving response data signals and response control signals from the memory. The reading/coding device codes the received response data signals with the response control signals and outputs the coded response signals to the test unit.

12 Claims, 2 Drawing Sheets

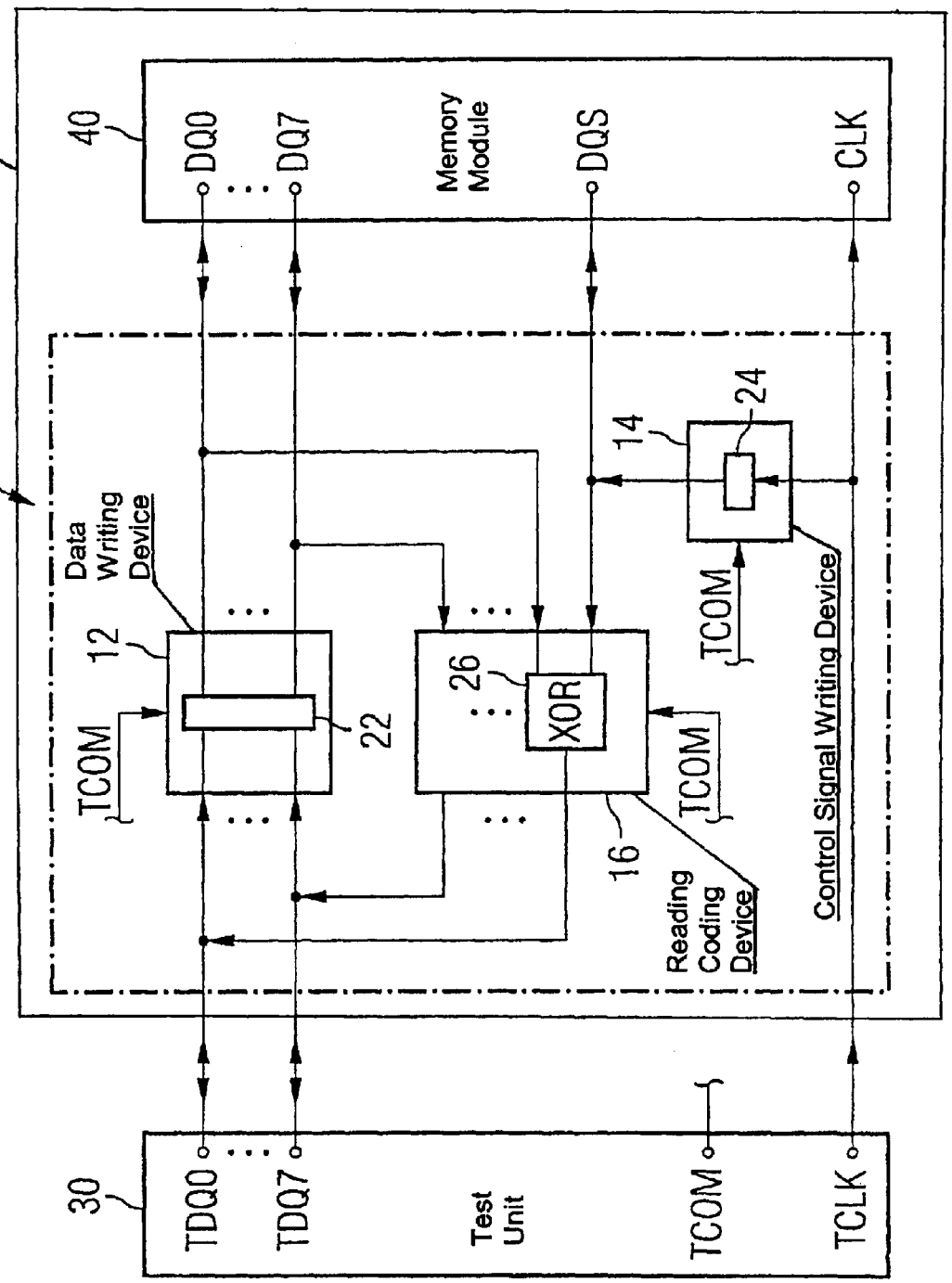

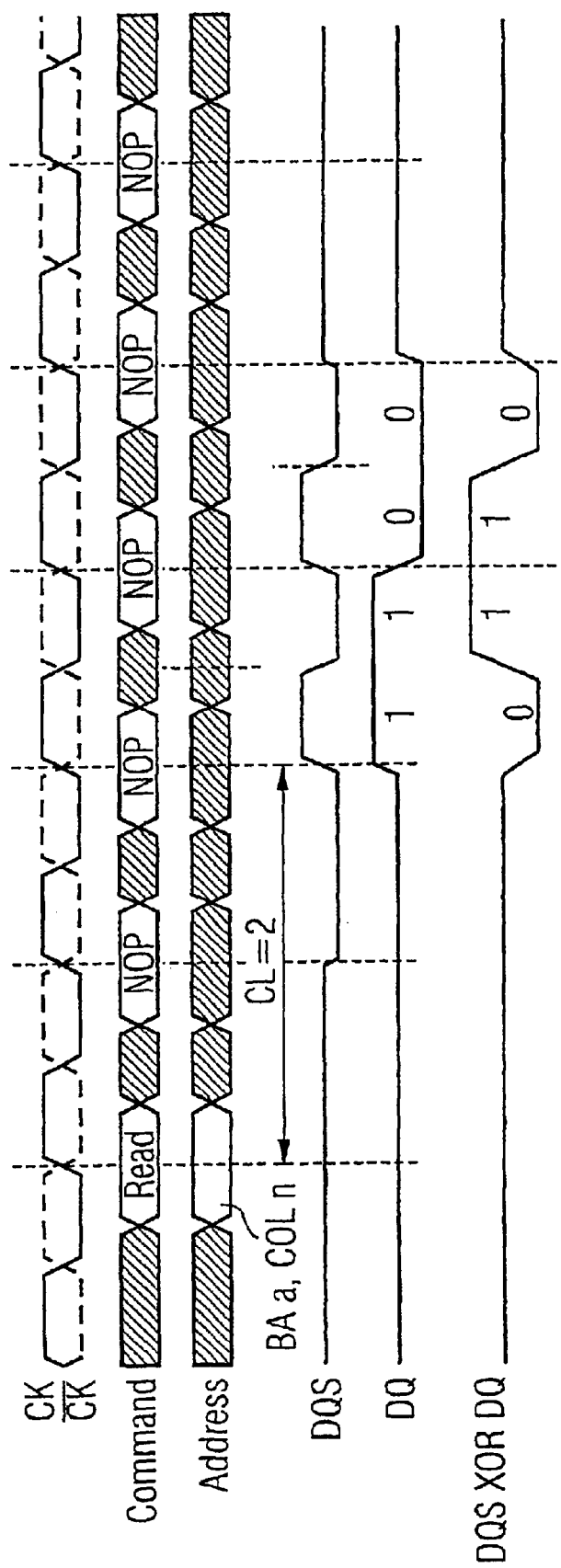

CONFIGURATION FOR TESTING AN INTEGRATED SEMICONDUCTOR MEMORY AND METHOD FOR TESTING THE MEMORY

BACKGROUND OF THE INVENTION

Field of the Invention

The invention relates to a configuration for testing an integrated semiconductor memory which has a control I/O terminal in addition to data I/O terminals, in which case, during the test, test signals are prescribed by a test unit and fed to the module to be tested and response signals output by the module to be tested are received for evaluation.

Before they are supplied, integrated semiconductor memories are tested by the manufacturer using costly memory test systems on which the functionality of the memory chips is checked by test programs. In this case, signals with precisely defined voltage levels are applied at exactly defined instants to the semiconductor memories to be tested. The response signals generated by the semiconductor memory are read into the test unit and compared with expected signal values.

On account of the high frequencies at which the memory modules operate nowadays, the specification of the chips requires a high accuracy of the signals. Thus, in double data rate (DDR) memories, for example, signal specifications of the order of magnitude of 400 picoseconds are customary even today. The production and memory test systems used must therefore satisfy extremely stringent technical requirements, which leads to correspondingly high production and test costs. In the case of extremely high-frequency memory modules, such as the above-mentioned DDR memories, the test costs already amount to up to 30% of the total manufacturing costs. For this reason, test concepts are being advanced in which as many memory modules as possible can be tested in parallel.

DDR-SDRAMs utilize for synchronization of the data transfer not only the normal system clock but an additional bi-directional strobe signal. This signal runs in parallel with the data and is used for the memory module as a reference for the validity of the transferred data and thereby enables a high-speed data transfer.

In the case of a read command, the DDR-SDRAM generates and controls the bi-directional strobe signal and indicates the validity of the data to the connected chip set with the rising and falling edges. In the case of a write operation, the chip set generates and controls the strobe signal and thus signals the validity of the data to be read in to the memory module with both edges. Roughly speaking by utilizing both clock edges, the effective data transfer rate is thus doubled compared with a single data rate (SDR) chip.

During the functional tests of the DDR memory modules, the problem arises that each bi-directional strobe signal DQS occupies an additional I/O test channel. However, such I/O test channels are available only in a very limited number on customary test adapters. By way of example, a test adapter from the company Advantest for conventional single data rate modules provides 72 bi-directional I/O channels per memory module, sufficient for nine memory modules of a module having eight data lines in each case. An entire test head can then be used to test eight memory modules in parallel.

When testing DDR memory, not only the bi-directional data lines but also the bi-directional DQS terminal must be tested for functionality. (8+1)×9=81 I/O channels are then required per memory module instead of 8×9=72 I/O channels in the case of single data rate memories. The higher number of I/O channels per module requires a new division of the assignment of the channels on the test head, which in practice leads to a halving of the test capacity.

Japanese Patent Abstract JP 2000207900 A discloses a test configuration for a DDR memory in which a circuit is integrated into the module to be tested, which circuit receives test control signals of a control channel of the test unit and forwards them as internal control signal.

SUMMARY OF THE INVENTION

It is accordingly an object of the invention to provide a configuration for testing an integrated semiconductor memory and a method for testing the memory which overcome the above-mentioned disadvantages of the prior art devices and methods of this general type, in which testing of semiconductor memories is performed with an additional bi-directional control terminal in a simple and cost-effective manner and in a highly parallel manner.

With the foregoing and other objects in view there is provided, in accordance with the invention, a configuration for assisting in testing a memory having a control I/O terminal and data I/O terminals. During a test, a test unit generates test signals to be fed to the memory and response signals output by the memory are received for evaluation. The configuration contains a circuit disposed and connected into a signal path between the test unit and the memory to be tested. The circuit includes a data writing device for receiving test data from data I/O channels of the test unit and for outputting the test data to the data I/O terminals of the memory to be tested, a control signal writing device for receiving test control signals from a control channel of the test unit and for outputting the test control signals to the control I/O terminal of the memory to be tested, and a reading/coding device for receiving response data signals from the data I/O terminals and response control signals from the control I/O terminal of the memory to be tested. The reading/coding device codes the response data signals with the response control signals and outputs coded response signals to the data I/O channels of the test unit. The reading/coding device is connected to the data writing device and to the control signal writing device.

The invention is thus based on the concept that, during writing, the bi-directional control terminal of the module to be tested is supplied with the signal of a unidirectional control channel of the test unit and, during reading, the response control signals generated are output to the test unit only indirectly via a coding of the response data signals. As a result, the functionality of the bi-directional control terminal can be tested without an additional I/O tester channel having to be provided.

The reading/coding device, for coding purposes, preferably combines at least the response data signals of one data I/O terminal with the response control signals of the control I/O terminal with an XOR combination. The reading/coding device particularly preferably carries out an XOR combination of the response data signals of all the data I/O terminals with the response control signals of the control I/O terminal. When a plurality of the data I/O terminals are combined with the control signals of the control I/O terminal, it is possible, in the error situation, to ascertain particularly reliably whether one of the data I/O terminals or the control I/O terminal is to be assessed as defective.

The data writing devices, the control signal writing device and the reading/coding device expediently receive command signals of the test unit for distinguishing between read and write accesses to the module to be tested.

In a preferred refinement, the data writing device contains a delay element for the adjustable delay of the test data signals. As an alternative or in addition, the control signal writing device advantageously contains a delay element for the adjustable delay of the test control signals.

It may be expedient to integrate the circuit on the module to be tested. The test logic can then be activated via a test mode, for example.

As an alternative, the circuit may be mounted on a test adapter that can be connected to the test unit. The circuit can then be fitted on the module or chip base.

With the foregoing and other objects in view there is provided, in accordance with the invention, a method for testing a memory having a control I/O terminal and data I/O terminals. The method includes the steps of: providing test data signals at data I/O channels of a test unit, providing a test control signal at a control channel of the test unit, and applying the test data signals to the data I/O terminals and the test control signal to the control I/O terminal of the memory to be tested. Response data signals are received from the data I/O terminals and response control signals are received from the control I/O terminal of the memory to be tested. The response data signals are coded with the response control signals. The coded response signals are output to the data I/O channels of the test unit.

In accordance with an added mode of the invention, there is the step of coding at least the response data signals of one of the data I/O terminals with the response control signals of the control I/O terminal by XOR combination.

In accordance with a further mode of the invention, there is the step of applying the test data signals and/or the test control signal with an adjustable temporal offset to at least one of the data I/O terminals and the control I/O terminal of the memory to be tested.

Other features which are considered as characteristic for the invention are set forth in the appended claims.

Although the invention is illustrated and described herein as embodied in a configuration for testing an integrated semiconductor memory and a method for testing the memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of an exemplary embodiment of a test configuration according to the invention; and FIG. 2 is a timing diagram illustrating a read operation from a DDR-SDRAM.

DESCRIPTION OF THE PREFERRED EMBODIMENTS

Referring now to the figures of the drawing in detail and first, particularly, to FIG. 1 thereof, there is shown a test unit 30 for testing a DDR-SDRAM 40 and has a series of bi-directional I/O channels for outputting and receiving test data, and unidirectional driver channels for outputting, for instance, data and control signals. Whereas the pure driver channels are available in a relatively large non-critical number, the number of bi-directional I/O channels is limited. In the exemplary embodiment, the test unit 30 has 8×72=576 I/O channels, of which eight are illustrated in FIG. 1, designated by TDQ0 to TDQ7.

I/O terminals DQ0 to DQ7 of the DDR-SDRAM 40 correspond to the terminals TDQ0 to TDQ7 of the test unit. The 576 I/O channels of the test unit 30 thus allow simultaneous testing of 72 memory modules 40 with 8 I/Os in each case, or eight memory modules 40 with 72 I/Os in each case. The exemplary embodiment of FIG. 1 shows the memory module 40 with 8 I/O terminals. However, for example, modules with 4 or 16 I/Os are also customary. The invention described is not restricted to a specific number of I/O terminals of the modules.

The test unit 30 has further terminals TCOM for outputting command signals, such as Write or Read, to the module 40 to be tested. A tester clock signal TCLK is passed to a corresponding CLK input of the DDR memory 40.

In order to be able to test not only the DQ terminals but also the functionality of the bi-directional strobe terminal DQS of the DDR memory 40, a circuit, a semiconductor circuit 10 in the exemplary embodiment, is inserted into the signal path between the test unit 30 and the DDR memory 40.

When writing data, test data are provided at the I/O channels TDQ0 to TDQ7 of the test unit 30. They are received by a data writing device 12 and, if appropriate with a delay set via the delay circuit 22, applied to the terminals DQ0 to DQ7 of the DDR memory 40.

The clock signal TCLK of the test unit 30 serves as a basis for the control signals applied to the DQS terminal. The TCLK signal is received by a control signal writing device 14, where a temporal offset of the DQS signal relative to the clock signal can be set by a delay element 24. An offset of zero corresponds to a parallel profile of the TCLK and DQS signals. For testing, the temporal offset is varied in accordance with the module specification, for example by half a clock period around the zero value. The control signal applied to the DQS terminal thus runs with the same frequency as the clock, but is shifted forward or backward relative to the latter as required.

When reading from the memory module 40, the read data signals of the data I/O terminals DQ0 to DQ7 and the response control signals of the DQS terminal are passed to a reading/coding device 16. The latter carries out, by XOR circuits 26, in each case an XOR combination between the data lines DQ and the DQS signal. The response signals coded in this way are output to the I/O test channels TDQ0 to TDQ7. This results in that the nine inputs are reduced to eight outputs in the reading/coding device 16.

The test unit 30 can then check the correctness of the data read and the correct functioning of the DQS terminal as now described. The DSQ signal which is output from the DDR memory 40 at the same time as the data changes between 0 and 1 with each new datum. As a result of the DQS signal being XORed with the data lines DQ, every second datum is conducted in inverted form to the test unit 30.

This can best be discerned in FIG. 2, which, for illustration purposes, shows a read burst of length 4. It is assumed that the bit sequence 1100 has previously been written to the DDR memory 40. If the read 4-bit data sequence is likewise 1100 in the correct manner as shown in FIG. 2, for example, then the combination DQS XOR DQ yields the bit sequence 0110. The bits 0 and 2 are thus output in inverted form, and the bits 1 and 3 in non-inverted form, by the reading/coding device 16.

The test unit 30 then compares the received data (0110 in the example) with the previously written data (1100 in the example) and identifies freedom from errors precisely when every second datum appears in inverted form. If the DQS path of the chip is defective, for example if the DQS signal has an excessively large time offset with respect to the clock, or if the DQS signal only runs with half the envisaged frequency, then when the written data are compared with the read data, corresponding errors are registered essentially on all the data channels TDQ0 to TDQ7. The defective nature of the DQS path can be inferred from this. In contrast, if errors occur only in the case of a specific data line, but the other data lines are rated as free of errors, the result is that not only these other data lines but also the DQS path is free of errors.

The data writing device 12, the control signal writing device 14 and the reading/coding device 16 identify from the command signals TCOM fed in whether a write or read access is currently being made to the semiconductor memory 40.

It is also possible to vary the combination of the DQS signal with the data. Instead of the simple XORing in the reading/coding device 16, it is also possible to use a somewhat more complicated circuit that, for example, inverts all the data during reading. Such a circuit inverts the datum coming from the chip data lines DQ0 to DQ7 precisely when the DQS signal has changed in the relevant clock cycle from 0 to 1 or from 1 to 0. Although this leads to a somewhat more complicated configuration of the reading coding device 16, it nonetheless simplifies the comparison of written and read signals in the test unit 30, where, specifically, it is often simpler to invert a written data sequence in its entirety for the comparison than to expect only every second bit in inverted form.

Finally, it is possible to integrate the circuit 10 and the memory module 40 on a common module 100. Alternatively, it is possible to mount the circuit 10 on a test adapter which can be connected to the test unit 30.

I claim:

1. A configuration for assisting in testing a memory having a control I/O terminal and data I/O terminals, and during a test, a test unit generates test signals to be fed to the memory and response signals output by the memory being received for evaluation, the configuration comprising:
    a circuit disposed and connected into a signal path between the test unit and the memory to be tested, the circuit including:
        a data writing device for receiving test data from data I/O channels of the test unit and for outputting the test data to the data I/O terminals of the memory to be tested;
        a control signal writing device for receiving test control signals of a control channel of the test unit and for outputting the test control signals to the control I/O terminal of the memory to be tested; and
        a reading/coding device for receiving response data signals from the data I/O terminals and response control signals from the control I/O terminal of the memory to be tested, said reading/coding device coding the response data signals with the response control signals and outputting coded response signals to the data I/O channels of the test unit, said reading/coding device connected to said data writing device and to said control signal writing device.

2. The test configuration according to claim 1, wherein said reading/coding device, for coding purposes, XORs the response data signals of at least one of the data I/O terminals, with the response control signals of the control I/O terminal.

3. The test configuration according to claim 1, wherein said data writing device, said control signal writing device and said reading/coding device receive command signals from the test unit for distinguishing between read and write accesses to the memory to be tested.

4. The test configuration according to claim 1, wherein said data writing device has a delay element for adjustably delaying the test data.

5. The test configuration according to claim 1, wherein said control signal writing device has a delay element for adjustably delaying the test control signals.

6. The test configuration according to claim 1, further comprising a common module and said circuit and the memory to be tested are integrated on said common module.

7. The test configuration according to claim 1, including a test adapter that can be connected to the test unit and said circuit is mounted on said test adapter.

8. The test configuration according to claim 1, wherein said circuit tests a double data rate integrated semiconductor memory.

9. A method for testing a memory having a control I/O terminal and data I/O terminals, which comprises the steps of:
    providing test data signals at data I/O channels of a test unit;
    providing a test control signal at a control channel of the test unit;
    applying the test data signals to the data I/O terminals and the test control signal to the control I/O terminal of the memory to be tested;
    receiving response data signals from the data I/O terminals and response control signals from the control I/O terminal of the memory to be tested;
    coding the response data signals with the response control signals; and
    outputting coded response signals to the data I/O channels of the test unit.

10. The test method according to claim 9, which comprises coding at least the response data signals of one of the data I/O terminals with the response control signals of the control I/O terminal by XOR combination.

11. The test method according to claim 9, which comprises applying at least one of the test data signals and the test control signal with an adjustable temporal offset to at least one of the data I/O terminals and the control I/O terminal of the memory to be tested.

12. The test method according to claim 9, which comprises testing a double data rate integrated semiconductor memory as the memory to be tested.

* * * * *